United States Patent
Gao et al.

(10) Patent No.: US 10,243,007 B2
(45) Date of Patent: Mar. 26, 2019

(54) ARRAY SUBSTRATE AND MANUFACTURING METHOD THEREOF, DISPLAY PANEL AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Jilei Gao, Beijing (CN); Jing Sun, Beijing (CN); Jinliang Liu, Beijing (CN); Hongqiang Luo, Beijing (CN); Zuwen Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 0 days.

(21) Appl. No.: 15/737,276

(22) PCT Filed: May 4, 2017

(86) PCT No.: PCT/CN2017/083051
§ 371 (c)(1),
(2) Date: Dec. 15, 2017

(87) PCT Pub. No.: WO2018/098994
PCT Pub. Date: Jun. 7, 2018

(65) Prior Publication Data
US 2018/0374877 A1    Dec. 27, 2018

(30) Foreign Application Priority Data
Nov. 29, 2016  (CN) .......................... 2016 1 1072838

(51) Int. Cl.
*H01L 27/146* (2006.01)
*H01L 27/12* (2006.01)
(Continued)

(52) U.S. Cl.
CPC ...... *H01L 27/1233* (2013.01); *H01L 21/0274* (2013.01); *H01L 27/0292* (2013.01);
(Continued)

(58) Field of Classification Search
CPC ....................................................... H01L 27/30
See application file for complete search history.

(56) References Cited

U.S. PATENT DOCUMENTS

| | | | |
|---|---|---|---|
| 2003/0081159 A1 | 5/2003 | Ha et al. | |
| 2003/0117559 A1* | 6/2003 | Kim .................. | G02F 1/134363 349/141 |

(Continued)

FOREIGN PATENT DOCUMENTS

| | | |
|---|---|---|
| CN | 1417622 A | 5/2003 |
| CN | 102881695 A | 1/2013 |
| CN | 103094304 A | 5/2013 |

OTHER PUBLICATIONS

Search Report for International Patent Application No. PCT/CN2017/083051 dated Aug. 9, 2017.

*Primary Examiner* — Cheung Lee
(74) *Attorney, Agent, or Firm* — Calfee, Halter & Griswold LLP (57) ABSTRACT

An array substrate, a display panel and display device including the array substrate, and a method of manufacturing the array substrate are provided. The array substrate includes a display area, a plurality of first transistors disposed in the display area, a non-display area disposed at a periphery of the display area and a plurality of second transistors disposed in the non-display area, wherein com-
(Continued)

pared to the plurality of first transistors, an active layer of each second transistor has a smaller thickness.

8 Claims, 5 Drawing Sheets

(51) Int. Cl.
*H01L 27/02* (2006.01)
*H01L 21/027* (2006.01)

(52) U.S. Cl.
CPC ........ *H01L 27/127* (2013.01); *H01L 27/1244* (2013.01); *H01L 27/1262* (2013.01); *H01L 27/1288* (2013.01); *H01L 27/14601* (2013.01); *H01L 27/14616* (2013.01)

(56) References Cited

U.S. PATENT DOCUMENTS

| | | |
|---|---|---|
| 2010/0123138 A1 | 5/2010 | Choi et al. |
| 2013/0015459 A1 | 1/2013 | Lee et al. |
| 2013/0112975 A1 | 5/2013 | Choi et al. |

* cited by examiner

ARRAY SUBSTRATE AND MANUFACTURING METHOD THEREOF, DISPLAY PANEL AND DISPLAY DEVICE

CROSS REFERENCE TO RELATED APPLICATION

This application is the U.S. national phase entry of PCT/CN2017/083051, with an international filing date of May 4, 2017, which claims priority to the Chinese patent application No. 201611072838.7 filed on Nov. 29, 2016, the entirety of which is incorporated herein by reference.

TECHNICAL FIELD

The present disclosure generally relates to the field of display technology, and in particular to an array substrate, a display panel and a display device comprising the array substrate, and a manufacturing method of the array substrate.

BACKGROUND

In a display panel comprising a Thin Film Transistor (TFT) array substrate, the Electro-Static Discharge (ESD) phenomenon may damage internal structures of the TFT array substrate. In particular, the ESD tends to breakdown a channel region of the TFT, causing damage to the TFT, thereby affecting normal display of the display panel.

It has been proposed in the related art to form a short-circuit ring in the array substrate to overcome the problem of ESD in the display panel. However, in the entire process of manufacturing the array substrate, the short-circuit ring is usually formed after forming the channel region of the TFT. Unfortunately, before the short-circuit ring is formed and after the channel region is formed, charge accumulation is often resulted from factors like processes, which causes instantaneous high current. Such high current will breakdown insulating layers between different metal layers of the array substrate as well as the channel region of the TFT, thereby affecting yield of products.

Therefore, there is the need in the art for improved array substrate and display panel.

SUMMARY

According to one aspect of the present disclosure, an array substrate is provided, which comprises a display area, a plurality of first transistors disposed in the display area, a non-display area disposed at a periphery of the display area and a plurality of second transistors disposed in the non-display area. An active layer of each second transistor has a smaller thickness than that of an active layer of each first transistor.

In some exemplary embodiments, the display area further comprises a plurality of gate lines and a plurality of data lines intersecting with each other. Each first transistor is disposed at each intersection of the plurality of gate lines and the plurality of data lines, and a control terminal of each first transistor is connected to a corresponding gate line, and a first terminal of each first transistor is connected to a corresponding data line.

In some exemplary embodiments, the first terminal of each first transistor is a source or a drain of the first transistor. For example, when the first transistors are N-type transistors, the first terminals of the first transistors are drains. In addition, second terminals of the first transistors (which are sources in the case of N-type transistors) are connected to corresponding light-emitting units so as to provide drive signals to the light-emitting units.

In some exemplary embodiments, the plurality of data lines extend into the non-display area, and the non-display area further comprises one or more first auxiliary lines parallel to the plurality of gate lines in the display area. The plurality of data lines intersect with the one or more first auxiliary lines, and each second transistor is disposed at each intersection of the plurality of data lines and the one or more first auxiliary lines. A control terminal of each second transistor is connected to a corresponding first auxiliary line, and a first terminal of each second transistor is connected to a corresponding data line.

In some exemplary embodiments, the plurality of gate lines extend into the non-display area, and the non-display area further comprises one or more second auxiliary lines parallel to the plurality of data lines in the display area. The plurality of gate lines intersect with the one or more second auxiliary lines, and each second transistor is disposed at each intersection of the plurality of gate lines and the one or more second auxiliary lines. A control terminal of each second transistor is connected to a corresponding gate line, and a first terminal of each second transistor is connected to a corresponding second auxiliary line.

In some exemplary embodiments, the plurality of data lines extend into the non-display area, the plurality of gate lines extend to the non-display area, and the non-display area further comprises one or more first auxiliary lines parallel to the plurality of gate lines in the display area and one or more second auxiliary lines parallel to the plurality of data lines in the display area. Each of some of the plurality of second transistors is disposed at each intersection of the plurality of data lines and the one or more first auxiliary lines, a control terminal of which is connected to a corresponding first auxiliary line, and a first terminal of which is connected to a corresponding data line. Each of the rest of the plurality of second transistors is disposed at each intersection of the plurality of gate lines and the one or more second auxiliary line, a control terminal of which is connected to a corresponding gate line, and a first terminal of which is connected to a corresponding second auxiliary line.

In some exemplary embodiments, a first terminal of each second transistor is a source or a drain of the second transistor. Similar to the situation of the first transistors, when the second transistors are N-type transistors, the first terminals of the second transistors are drains.

In some exemplary embodiments, both the plurality of first transistors and the plurality of second transistors are P-type transistors or N-type transistors.

According to another aspect of the present disclosure, a display panel is provided, which comprises any of the above-described array substrate.

In some exemplary embodiments, the display panel has a Twisted Nematic (TN) or an Advanced Super Dimensional Field Conversion (ADS) display mode. That is, the principle of the present disclosure is applicable to a display panel having multiple display modes including TN and ADS.

According to still another aspect of the present disclosure, a display device is provided, which comprises the above-mentioned display panel.

According to a further aspect of the present disclosure, a method for manufacturing an array substrate is provided. The array substrate comprises a display area, a plurality of first transistors disposed in the display area, a non-display area disposed at a periphery of the display area and a plurality of second transistors disposed in the non-display area. The method comprises forming a semiconductor layer, a source/drain metal layer and a photoresist in turn. The method further comprises exposing the photoresist in regions where channels of the plurality of first transistors and the plurality of second transistor are to be formed, wherein a degree of exposure of the photoresist in regions where the channels of the plurality of first transistors are to be formed is lower than a degree of exposure of the photoresist in regions where channels of the plurality of second transistors are to be formed. For example, the step of exposing may include: partially exposing the photoresist in regions where channels of the plurality of first transistors and the plurality of second transistors are to be formed, and fully exposing the photoresist in a region where intermediates between the plurality of first transistors and the plurality of second transistors are to be formed.

Next, the photoresist is developed. Since the degree of exposure of the photoresist in the regions where the channels of the plurality of first transistors are to be formed is lower than the degree of exposure of the photoresist in the regions where the channels of the plurality of second transistors are to be formed, after developing, a thickness of remaining photoresist in the regions where the channels of the plurality of first transistors are to be formed is greater than a thickness of remaining photoresist in the regions where the channels of the plurality of second transistors are to be formed.

Then, the source/drain metal layer and part of the semiconductor layer in the regions where the channels of the plurality of first transistors and the plurality of second transistors are to be formed are etched away respectively so as to form active layers of the plurality of first transistors and the plurality of second transistors. For example, this step may include: ashing the photoresist until the source/drain metal layer is exposed in the regions where channels of the plurality of second transistors are to be formed. Since the thickness of remaining photoresist in the regions where the channels of the plurality of first transistors are to be formed is greater than the thickness of remaining photoresist in the regions where the channels of the plurality of second transistors are to be formed, after the ashing, the source/drain metal layer is not exposed in the regions where the channels of the plurality of first transistors are to be formed, and there are still photoresist left. The exposed portions of the source/drain metal layer are etched away and the semiconductor layer is partially etched away. The photoresist is ashed again until the source/drain metal layer is exposed in the regions where the channels of the plurality of first transistors are to be formed. The exposed portions of the source/drain metal layer is etched away and the semiconductor layer is partially etched away.

Finally, the photoresist is removed.

In the resulting array substrate, an active layer of each second transistor has a smaller thickness than that of an active layer of each first transistor.

The term "ashing" as used herein refers to a process of etching the photoresist so as to thin the photoresist. The term "partially exposing" as used herein refers to a process in which light irradiates on the photoresist through a lithographic mask having both a transmission property and a reflection property, so that the photoresist is partially denaturalized and be thinned in the developing process subsequently rather than being completely removed. In contrast, the term "fully exposing" as used herein refers to a process in which light irradiates on the photoresist directly or through a total-transmissive lithographic mask, so that the photoresist is completely denaturalized and be completely removed in the developing process subsequently.

In some exemplary embodiments, the method further comprises etching away the source/drain metal layer and the semiconductor layer in regions where intermediates between the plurality of first transistors and the plurality of second transistors are to be formed.

In some exemplary embodiments, partially exposing the photoresist in regions where the channels of the plurality of first transistors and the plurality of second transistors are to be formed includes: performing ⅓ exposure of the photoresist in regions where channels of the plurality of first transistors are to be formed, and performing ⅔ exposure of the photoresist in regions where channels of the plurality of second transistors are to be formed.

The term "⅓ exposure" as used herein refers to that one third of light penetrates the lithographic mask to irradiate on the photoresist, so that after developing, one third of thickness of the photoresist is denaturalized. Positive photoresist is taken as an example here. Of course, negative photoresist can also be used and those skilled in the art can adjust the exposure ratio as desired.

In some exemplary embodiments, the method further comprises forming an electro-static discharge short-circuit ring on the array substrate after removing the photoresist.

In some exemplary embodiments, the method further comprises cutting off the non-display area after forming the electro-static discharge short-circuit ring. Since the electro-static discharge short-circuit ring can prevent the TFT from being damaged by the electro-static discharge in the array substrate, the non-display area can be cut off so as to reduce the size of the finally obtained display device.

In some exemplary embodiments, the method further comprises forming, on the substrate, a plurality of gate lines and a plurality of data lines intersecting with each other, wherein the plurality of gate lines are connected to one another with one or a couple of gate lines skipped therebetween or they are all connected, and/or the plurality of data lines are connected to one another with one or a couple of data lines skipped therebetween or they are all connected.

In some exemplary embodiments, the step of cutting off the non-display area further comprises cutting off connecting parts of the plurality of gate lines and the plurality of data lines, so that the plurality of gate lines are electrically insulated from one another, and the plurality of data lines are electrically insulated from one another. For example, the connecting parts of the plurality of gate lines and the plurality of data lines are in the non-display area.

These and other aspects of the present disclosure will become apparent from and will be depicted with reference to the embodiments described below.

DETAILED DESCRIPTION s Exemplary embodiments of the present disclosure will be described in detail below with reference to the drawings.

The drawings are schematic and are not drawn to scale, and they only intend to illustrate the embodiments of the present disclosure rather than limiting the protection scope of the present disclosure. In the drawings, the same reference signs represent the same or similar components. In order to make the technical solution of the present disclosure clearer, technological steps and devices known in the art are omitted herein.

It shall be noted that all the transistors mentioned herein can be thin film transistors or field effect transistors or other devices having the same characteristics. Here, in order to differentiate the other two terminals than the gate (i.e. control terminal) of a transistor, one of them is called the first terminal and the other is called the second terminal. In addition, according to the different characteristics of the transistors, the transistors can be classified as N-type and P-type transistors. N-type transistor is taken as an example for illustration in the embodiments below, and when using the N-type transistor, the first terminal can be a drain of the N-type transistor, and the second terminal can be a source of the N-type transistor. As will be appreciated by those skilled in the art, the object of the present disclosure can also be achieved by using P-type transistors.

Figure 1:
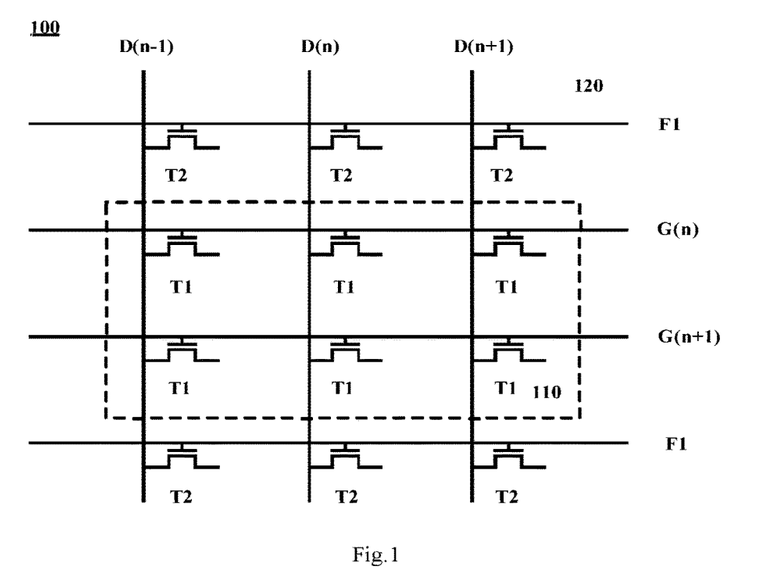
FIG. 1 is a schematic drawing of an array substrate according to an embodiment of the present disclosure.

FIG. 1 schematically illustrates an array substrate according to an embodiment of the present disclosure. As shown in FIG. 1, an array substrate 100 comprises a display area 110, a plurality of first transistors T1 disposed in the display area 110, a non-display area 120 disposed at a periphery of the display area 110 and a plurality of second transistors T2 disposed in the non-display area 120. Compared to the first transistors T1, an active layer of each second transistor T2 has a smaller thickness.

In the array substrate 100 as shown in FIG. 1, since the thickness of the active layer of each second transistor T2 is smaller than the thickness of the active layer of each first transistor T1, if charge accumulation occurs, electro-static discharge will preferably occur in the non-display area 120, while the plurality of first transistors T1 disposed in the display area 110 will not be affected by the electro-static discharge. Therefore, the products could have better anti-ESD capability and yield.

Optionally, as shown in FIG. 1, the display area 110 further comprises a plurality of gate lines G(n), G(n+1) and a plurality of data lines D(n−1), D(n), D(n+1) intersecting with each other. Each first transistor T1 is disposed at each intersection of the plurality of gate lines and one or more data lines, a control terminal of the first transistor T1 is connected to a corresponding gate line, and a first terminal of the first transistor T1 is connected to a corresponding data line.

In one embodiment shown in FIG. 1, the plurality of data lines D(n−1), D(n), D(n+1) extend into the non-display area 120, and the non-display area 120 further comprises one or more first auxiliary lines F1 parallel to the plurality of gate lines G(n), G(n+1) in the display area 110. The plurality of data lines D(n−1), D(n), D(n+1) intersect with the one or more first auxiliary lines F1. Each second transistor T2 is disposed at each intersection of the plurality of data lines and the one or more first auxiliary lines, a control terminal of the second transistor T2 is connected to a corresponding first auxiliary line, and a first terminal of the second transistor T2 is connected to a corresponding data line.

The first terminal of each first transistor T1 is a source or a drain of the first transistor. For example, when the plurality of first transistors are N-type transistors, the first terminals of the plurality of first transistors are drains. In addition, second terminals of the plurality of first transistors (which are sources in the case of N-type transistors) are connected to corresponding light-emitting units so as to provide drive signals to the light-emitting units. The first terminal of each second transistor T2 is a source or a drain of the second transistor T2. Similar to the situation of the first transistors, when the plurality of second transistors T2 are N-type transistors, the first terminals of the plurality of second transistors T2 are drains.

In such an embodiment, the plurality of first transistors T1 and the plurality of second transistors T2 share data lines D(n−1), D(n), D(n+1). When electro-static discharge occurs on the array substrate 100 due to charge accumulation, the high current generated will flow to the plurality of second transistors T2 to breakdown the plurality of second transistors T2 while protecting the plurality of first transistors T1 from being affected, thus ensuring normal operation of the display panel.

Figure 2:
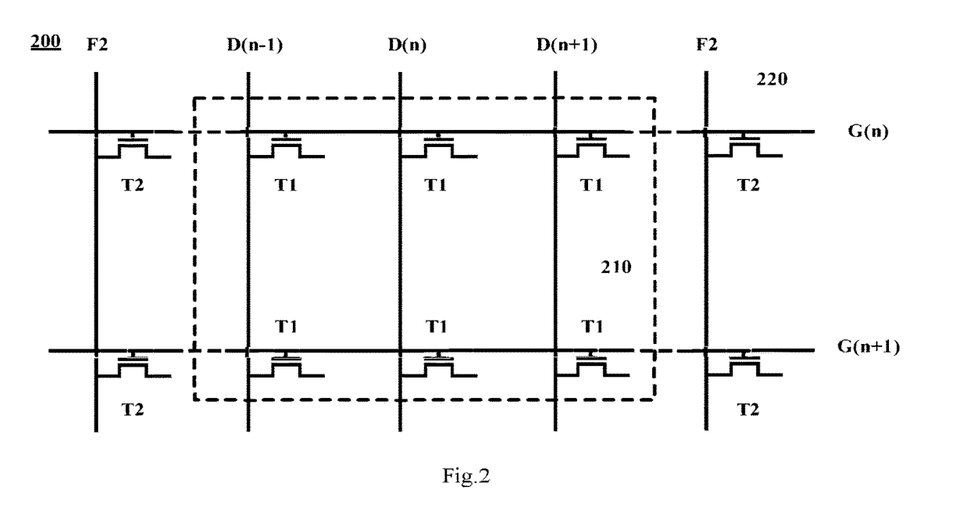
FIG. 2 is a schematic drawing of an array substrate according to another embodiment of the present disclosure.

FIG. 2 schematically illustrates an array substrate according to another embodiment of the present disclosure. Similar to the array substrate 100, an array substrate 200 comprises a display area 210, a plurality of first transistors T1 disposed in the display area 210, a non-display area 220 disposed at a periphery of the display area 210 and a plurality of second transistors T2 disposed in the non-display area 220. Compared to the plurality of first transistors T1, a thickness of an active layer of each second transistor T2 is smaller.

Optionally, as shown in FIG. 2, the display area 210 further comprises a plurality of gate lines G(n), G(n+1) and a plurality of data lines D(n−1), D(n), D(n+1) intersecting with each other. Each first transistor T1 is disposed at each intersection of the plurality of gate lines and one or more data lines, a control terminal of the first transistor T1 is connected to a corresponding gate line, and a first terminal of first transistor T1 is connected to a corresponding data line.

However, unlike in array substrate 100, in array substrate 200, the plurality of gate lines G(n), G(n+1) extend into the non-display area 220, and the non-display area 220 further comprises one or more second auxiliary lines F2 parallel to the plurality of data lines D(n−1), D(n), D(n+1) in the display area. The plurality of gate lines G(n), G(n+1) intersect with the one or more second auxiliary lines F2. Each second transistor T2 is disposed at each intersection of the plurality of gate lines and the one or more second auxiliary lines, a control terminal of the second transistor T2 is connected to a corresponding gate line, and a first terminal of the second transistor T2 is connected to a corresponding second auxiliary line.

In such an embodiment, the plurality of first transistors T1 and the plurality of second transistors T2 share gate lines G(n), G(n+1). Likewise, when electro-static discharge occurs on the array substrate due to charge accumulation, the high current generated will flow to the plurality of second transistors T2 to breakdown the plurality of second transistors T2 while protecting the plurality of first transistors T1 from being affected, thus ensuring normal operation of the display panel.

In the array substrate 100 and the array substrate 200, the plurality of first transistors T1 and the plurality of second transistors T2 can both be P-type transistors or N-type transistors.

Figure 3:
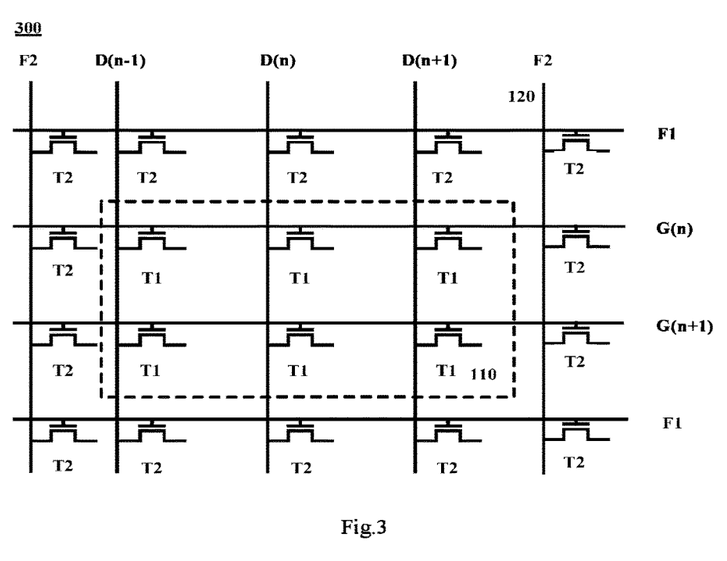
FIG. 3 is a schematic drawing of an array substrate according to a further embodiment of the present disclosure.

The embodiments shown in FIG. 1 and FIG. 2 can be combined. For example, as shown in FIG. 3, in one embodiment, the plurality of data lines D(n−1), D(n), D(n+1) extend into the non-display area, the plurality of gate lines G(n), G(n+1) extend into the non-display area, and the non-display area further comprises one or more first auxiliary lines F1 parallel to the plurality of gate lines G(n), G(n+1) in the display area as well as one or more second auxiliary lines F2 parallel to the plurality of data lines D(n−1), D(n), D(n+1) in the display area. Each of some of the plurality of second transistors T2 is disposed at each intersection of the plurality of data lines and the one or more first auxiliary lines F1, a control terminal of which is connected to a corresponding first auxiliary line F1, and a first terminal of which is connected to a corresponding data line. Each of the rest of the plurality of second transistors T2 is disposed at each intersection of the plurality of gate lines and the one or more second auxiliary lines F2, a control terminal of which is connected to a corresponding gate line, and a first terminal of which is connected to a corresponding second auxiliary line F2.

A method for manufacturing any of the above-mentioned array substrate according to an embodiment of the present disclosure will be described in detail below with reference to FIGS. 4(a)-4(g). It shall be noted that although the method for manufacturing an array substrate is divided into several steps in FIGS. 4(a)-4(g), it is only for facilitating description. Besides, although the method for manufacturing an array substrate is demonstrated in a certain order, such method is not limited to the order shown in the figures. In fact, the manufacturing method in FIGS. 4(a)-4(g) can be divided into several steps as appropriate, and different steps may interleave or merge in time without departing from the spirit and scope of the present disclosure.

Figure 4A:
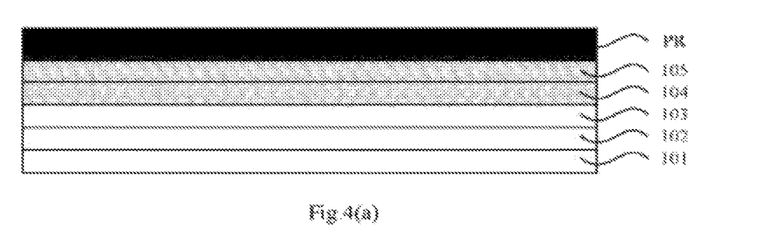
FIGS. 4(a)-4(h) are schematic drawings of steps of a method for manufacturing an array substrate according to an embodiment of the present disclosure.

As shown in FIG. 4(a), a gate metal layer 102, a gate insulating layer 103, a semiconductor layer 104 and a source/drain metal layer 105 are formed first on a substrate 101, and a photoresist PR is deposited on the source/drain metal layer 105.

Figure 4B:
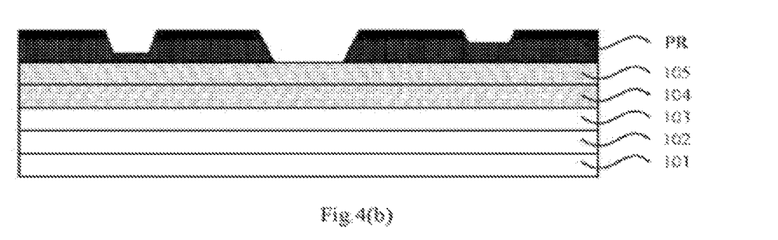

Then, the photoresist PR in regions where channels of a plurality of first transistors and a plurality of second transistors are to be formed are partially exposed, and the photoresist in regions where intermediates between the plurality of first transistors and the plurality of second transistors are to be formed are fully exposed. A degree of exposure of the photoresist in the region where the channels of the plurality of first transistors are to be formed is lower than a degree of exposure of the photoresist in the regions where the channels of the plurality of second transistors are to be formed. The above process can be finished in one exposure, wherein different regions of a lithographic mask used in the exposure may have different transmission and reflection properties. For example, portions of the lithographic mask corresponding to the regions where the channels of the plurality of first transistors and the plurality of second transistors are to be formed have both transmission property and reflection property, while portions of the lithographic mask corresponding to the regions where intermediates between the plurality of first transistors and the plurality of second transistors are to be formed is totally-transmissive. Moreover, portions of the lithographic mask corresponding to the regions where the channels of the plurality of first transistors are to be formed have different transmission and reflection properties than portions of the lithographic mask corresponding to the regions where the channels of the plurality of second transistors are to be formed. Of course, above process can also be finished through several times of exposure. After completion of the exposure, the photoresist PR is developed. As shown in FIG. 4(b), since the degree of exposure of the photoresist in the regions where the channels of the plurality of first transistors are to be formed is lower than the degree of exposure of the photoresist in the regions where the channels of the plurality of second transistors are to be formed, a thickness of remaining photoresist in the regions where the channels of the plurality of first transistors are to be formed is greater than a thickness of remaining photoresist in the regions where the channels of the plurality of second transistors are to be formed. The photoresist in the regions where intermediates between the plurality of first transistors and the plurality of second transistors are to be formed are completely removed.

Figure 4C:
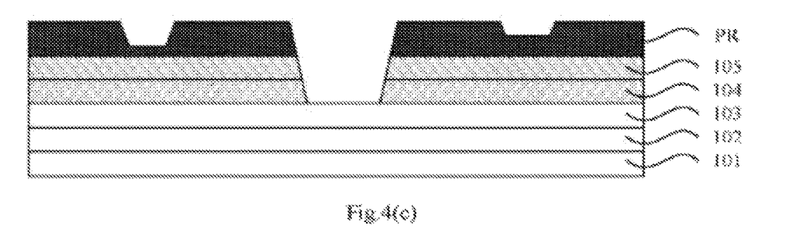

Next, as shown in FIG. 4(c), the source/drain metal layer 105 and the semiconductor layer 104 in the regions where intermediates between the plurality of first transistors and the plurality of second transistors are to be formed are etched away.

Figure 4D:
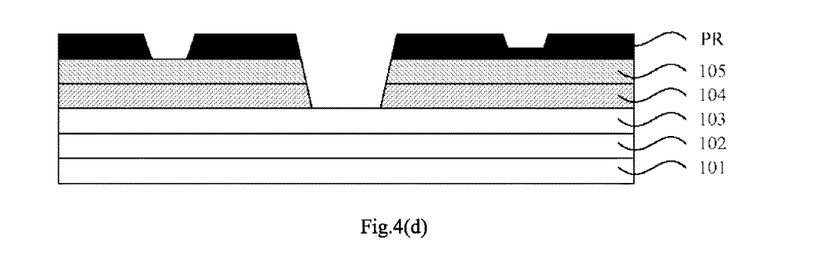

Then, as shown in FIG. 4(d), the photoresist is ashed until the source/drain metal layer 105 is exposed in the regions where the channels of the plurality of second transistors are to be formed. Since the thickness of remaining photoresist in the regions where the channels of the plurality of first transistors are to be formed is greater than the thickness of remaining photoresist in the regions where the channels of the plurality of second transistors are to be formed, after the ashing, the source/drain metal layer 105 is not exposed in the regions where the channels of the plurality of first transistors are to be formed, and there is still photoresist left.

Figure 4E:
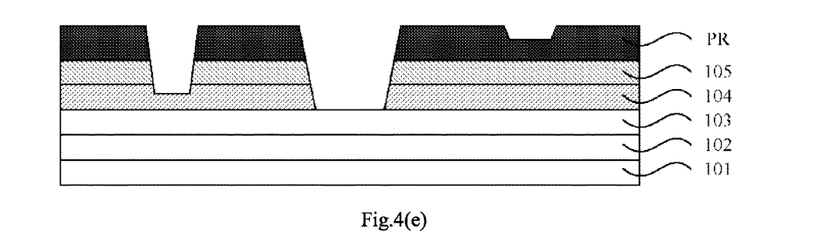

Next, as shown in FIG. 4(e), the exposed source/drain metal layer 105 is etched away and the semiconductor layer 104 is partially etched away to form active regions of the plurality of second transistors.

Figures 4F, 4G:
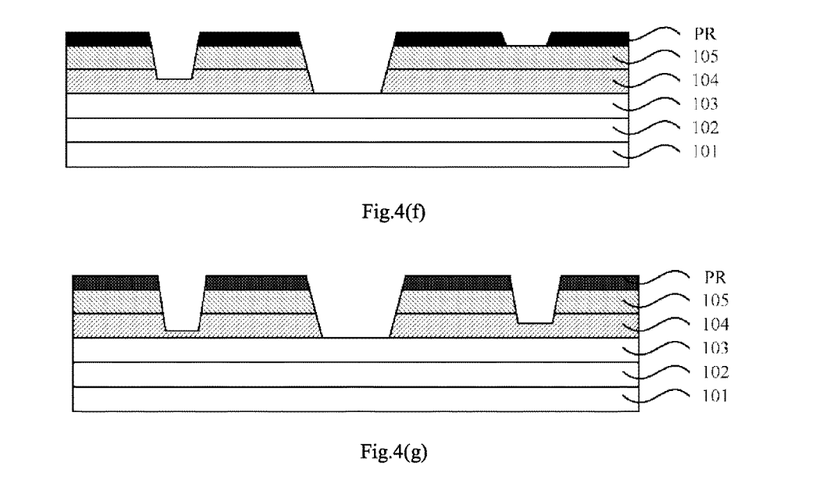

Then, as shown in FIG. 4(f), the photoresist PR is ashed again until the source/drain metal layer 105 is exposed in the regions where the channels of the plurality of first transistors are to be formed.

Subsequently, as shown in FIG. 4(g), the exposed source/drain metal layer 105 is etched away and the semiconductor layer 104 is partially etched away to form active regions of the plurality of first transistors.

Figure 4H:
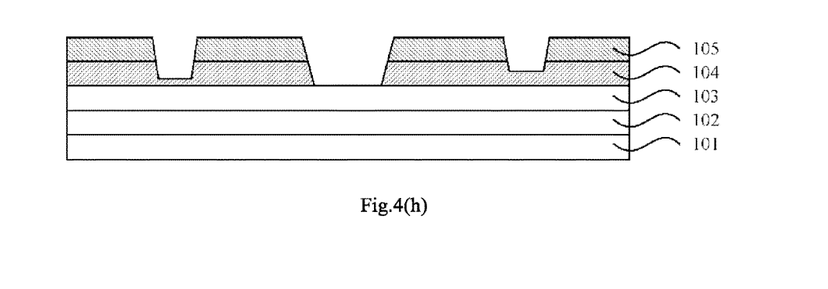

Finally, the photoresist PR is removed. The finally resulting array substrate is as shown in FIG. 4(h). In the resulting array substrate, the remaining semiconductor layers in the channel regions of the plurality of first and second transistors serve as active layers of the plurality of first and second transistors, respectively, and as shown in FIG. 4(h), compared to the plurality of first transistors, the thickness of the active layer of each second transistor is smaller.

In the above method provided in the present disclosure, without increasing the number of masks, the plurality of first transistors in the display area and the plurality of second transistors in the non-display area, which have active layers of different thicknesses, are fabricated by one exposure and development, thus the manufacturing cost of the array substrate will not be significantly increased. Since the thickness of the active layer of each second transistor is smaller than the thickness of the active layer of each first transistor, if charge accumulation occurs, electro-static discharge will preferably occur in the non-display area, while the plurality of first transistors disposed in the display area will not be affected by the electro-static discharge. Therefore, the manufactured products could have better anti-ESD capability and yield.

In an exemplary embodiment, partially exposing the photoresist in regions where channels of the plurality of first transistors and the plurality of second transistors are to be formed includes: performing ⅓ exposure of the photoresist in the regions where the channels of the plurality of first transistors are to be formed, and performing ⅔ exposure of the photoresist in the regions where the channels of the plurality of second transistors are to be formed. During actual implementation, those skilled in the art can design other appropriate exposure ratio for the photoresist as desired.

In one embodiment, the above method further comprises forming an electro-static discharge short-circuit ring on the array substrate after removing the photoresist PR. The electro-static discharge short-circuit ring is usually used for coping with the electro-static discharge phenomenon in the array substrate and protecting the display area of the array substrate from being affected by the electro-static discharge.

Therefore, in the array substrate having the electro-static discharge short-circuit ring, the above method may further comprise cutting off the non-display area after forming the electro-static discharge short-circuit ring. Since the electro-static discharge short-circuit ring can prevent the transistors from being damaged by the electro-static discharge in the array substrate, the non-display area can be cut off to reduce the size of the finally obtained display device.

Figure 5:
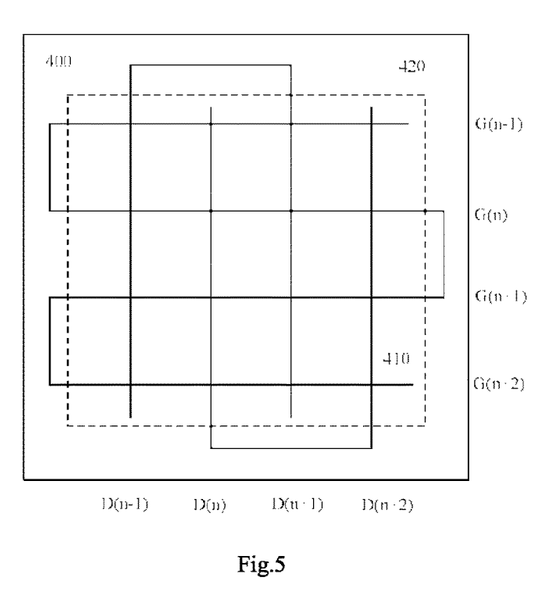
FIG. 5 schematically illustrates arrangements of gate lines and data lines in an array substrate.

In one embodiment, the above method may further comprise forming a plurality of gate lines and a plurality of data lines intersecting with each other on the substrate. FIG. 5 schematically shows patterns of the formed plurality of gate lines and plurality of data lines, and for simplicity, transistors are omitted therein.

As shown in FIG. 5, the plurality of gate lines G(n−1), G(n), G(n+1), G(n+2) are all connected together, and the plurality of data lines D(n−1), D(n), D(n+1), D(n+2) are connected every other line, namely, data lines D(n−1), D(n+1) in the odd columns are connected to one another, and data lines D(n), D(n+2) in the even columns are connected to one another. Alternatively, the gate lines may be connected to one another with one or a couple of gate lines skipped therebetween, and the data lines may be all connected together or be connected with a couple of date lines skipped therebetween.

A purpose of such a design is that after fabricating the gate lines and data lines, the gate lines and data lines usually need to be tested to make sure that they are electrically connected. Hence, in such an embodiment, by connecting the plurality of gate lines with one or a couple of gate lines skipped therebetween or connecting them all together, and/or by connecting the plurality of data lines with one or a couple of data lines skipped therebetween or connecting them all together, the test can be simplified and the cost of test can be reduced.

However, after the test is completed, the plurality of gate lines must be made electrically insulated from each other and the plurality of data lines must be made electrically insulated from each other so as to ensure normal operation of the array substrate. For example, the step of cutting off the non-display area may further comprise cutting off connecting parts of the plurality of gate lines and the plurality of data lines, so that the plurality of gate lines are electrically insulated from one another, and the plurality of data lines are electrically insulated from one another. As shown in FIG. 5, the connecting parts of the plurality of gate lines and the plurality of data lines are in the non-display area (outside the dashed frame), so the connecting parts of the plurality of gate lines and the plurality of data lines are cut off while cutting off the non-display area, so that the plurality of gate lines are electrically insulated from one another and the plurality of data lines are electrically insulated from one another.

The present disclosure further provides a display panel and a display device, comprising the array substrate described in any one of the above embodiments.

The display panel and display device provided in the present disclosure may have a Twisted Nematic (TN) or an Advanced Super Dimensional Field Conversion (ADS) display mode. That is, the principle of the present disclosure is applicable to multiple display modes including TN and ADS.

The concept of the present disclosure can be widely applied to any system having a display function, including a desktop computer, a laptop computer, a mobile phone, a tablet computer, etc. In addition, although several embodiments have been described in detail herein, other modifications are possible. For example, the flow chart described above does not require to achieve the expected result with the described specific order or sequence. Other steps may be provided, or steps can be removed from the described flow, and other components can be added into or be removed from the described system. Other embodiments may fall within the scope of the present disclosure. Under the teaching of the present disclosure, those skilled in the art can realize many variations and modifications without departing from the spirit and scope of the present disclosure.

The invention claimed is:

1. An array substrate, comprising a display area, a plurality of first transistors disposed in the display area, a non-display area disposed at a periphery of the display area and a plurality of second transistors disposed in the non-display area, wherein, a thickness of an active layer of each second transistor is smaller than a thickness of an active layer of each first transistor, wherein the display area further comprises a plurality of gate lines and a plurality of data lines intersecting with each other, the plurality of data lines extending into the non-display area, wherein the non-display area further comprises one or more first auxiliary lines parallel to the plurality of gate lines in the display area, the plurality of data lines intersecting with the one or more first auxiliary lines, each second transistor being disposed at each intersection of the plurality of data lines and the one or more first auxiliary lines, a control terminal of each second transistor being connected to a corresponding first auxiliary line, a first terminal of each second transistor being connected to a corresponding data line.

2. The array substrate according to claim 1, wherein the first terminals of the plurality of second transistors are sources or drains of the plurality of second transistors.

3. A method of manufacturing an array substrate, wherein the array substrate comprises a display area, a plurality of first transistors disposed in the display area, a non-display area disposed at a periphery of the display area and a plurality of second transistors disposed in the non-display area, the method comprising:

forming a semiconductor layer, a source/drain metal layer and a photoresist in turn;

exposing the photoresist in regions where channels of the plurality of first transistors and channels of the plurality of second transistors are to be formed, such that a degree of exposure of the photoresist in the regions where the channels of the plurality of first transistors are to be formed is lower than a degree of exposure of the photoresist in the regions where the channels of the plurality of second transistors are to be formed;

developing the photoresist;

in the regions where the channels of the plurality of first transistors and the channels of the plurality of second transistors are to be formed, etching away the source/drain metal layer and partially etching away the semiconductor layer so as to form active layers of the plurality of first transistors and the plurality of second transistors; and removing the photoresist, wherein a thickness of the active layer of each formed second transistor is smaller than a thickness of the active layer of each formed first transistor.

4. The method according to claim 3, wherein exposing the photoresist in regions where channels of the plurality of first transistors and channels of the plurality of second transistors are to be formed includes:

partially exposing the photoresist in the regions where the channels of the plurality of first transistors and the channels of the plurality of second transistors are to be formed, and fully exposing the photoresist in the regions where intermediates between the plurality of first transistors and the plurality of second transistors are to be formed.

5. The method according to claim 3, wherein, in the regions where the channels of the plurality of first transistors and the channels of the plurality of second transistors are to be formed, etching away the source/drain metal layer and partially etching away the semiconductor layer so as to form active layers of the plurality of first transistors and the plurality of second transistors, includes:

ashing the photoresist until the source/drain metal layer is exposed in the regions where the channels of the plurality of second transistors are to be formed;

etching away the exposed source/drain metal layer and partially etching away the semiconductor layer to form active layers of the plurality of second transistors;

ashing the photoresist after forming the active layers of the plurality of second transistors until the source/drain metal layer is exposed in the regions where the channels of the plurality of first transistors are to be formed; and etching away the exposed source/drain metal layer and partially etching away the semiconductor layer to form active layers of the plurality of first transistors.

6. The method according to claim 3, wherein exposing the photoresist in the regions where the channels of the plurality of first transistors and the channels of the plurality of second transistors are to be formed includes: performing $\frac{1}{3}$ exposure of the photoresist in the regions where the channels of the plurality of first transistors are to be formed, and performing $\frac{2}{3}$ exposure of the photoresist in the regions where the channels of the plurality of second transistors are to be formed.

7. The method according to claim 3, further comprising, in the regions where intermediates between the plurality of first transistors and the plurality of second transistors are to be formed, etching away the source/drain metal layer and the semiconductor layer.

8. The method according to claim 3, further comprising forming an electro-static discharge short-circuit ring on the array substrate after removing the photoresist.

* * * * *